United States Patent [19]

Yoshida

[11] Patent Number: 4,926,379
[45] Date of Patent: May 15, 1990

[54] DATA READ CIRCUIT FOR USE IN SEMICONDUCTOR MEMORY DEVICE

[75] Inventor: Masanobu Yoshida, Kawaguchi, Japan

[73] Assignee: Fujitsu Limited, Kawasaki, Japan

[21] Appl. No.: 300,245

[22] Filed: Jan. 19, 1989

Related U.S. Application Data

[63] Continuation of Ser. No. 1,780, Jan. 9, 1987, abandoned.

[30] Foreign Application Priority Data

Jan. 21, 1986 [JP] Japan ................................. 61-8962

[51] Int. Cl.$^5$ ...................... G11C 7/00; G11C 11/42
[52] U.S. Cl. ........................ 365/189.01; 365/230.01; 365/233.5; 307/481
[58] Field of Search ............. 365/230, 189, 207, 233, 365/189.01, 189.05, 230.08, 233.5, 204; 307/480, 481, 463, 234

[56] References Cited

U.S. PATENT DOCUMENTS

| | | | |
|---|---|---|---|
| 3,932,848 | 1/1976 | Porat | 365/204 |
| 4,388,541 | 6/1983 | Giebel | 365/204 X |
| 4,395,764 | 7/1983 | Matsue | 365/240 |
| 4,563,599 | 1/1986 | Donoghue et al. | 307/463 X |
| 4,570,244 | 2/1986 | Sud et al. | 365/230 |
| 4,633,102 | 12/1986 | Childers | 307/480 X |
| 4,707,623 | 11/1987 | Bismarck | 307/451 X |
| 4,719,603 | 1/1988 | Shinagawa et al. | 365/230 |
| 4,728,820 | 3/1988 | Lee | 307/481 X |
| 4,733,377 | 3/1988 | Aoyama et al. | 365/227 X |
| 4,739,198 | 4/1988 | Maruyama | 307/530 |
| 4,751,680 | 6/1988 | Wang et al. | 365/230 X |
| 4,751,683 | 6/1988 | Wada et al. | 365/230 |

FOREIGN PATENT DOCUMENTS

| | | |
|---|---|---|
| 0015070 | 9/1980 | European Pat. Off. |
| 0136229 | 4/1985 | European Pat. Off. |
| 2103256 | 8/1971 | Fed. Rep. of Germany |
| 219615 | 3/1985 | Fed. Rep. of Germany |
| 62-20195 | 1/1987 | Japan ................................. 365/230 |

*Primary Examiner*—Stuart N. Hecker
*Assistant Examiner*—Alyssa H. Bowler
*Attorney, Agent, or Firm*—Armstrong, Nikaido, Marmelstein, Kobovcik & Murray

[57] ABSTRACT

A data read circuit for use in a semiconductor memory device including an input node operatively connected to a bit line; an output node for outputting a read-out signal; a first transistor connected between the input node and the output node and turned ON and OFF in accordance with a potential of the bit line connected to a selected memory cell transistor; a second transistor connected to the output node and turned ON for a predetermined period after an address signal is changed; and a third transistor connected to the second transistor in parallel and turned ON and OFF in accordance with the read-out signal so that the third transistor is turned OFF when the selected memory cell transistor is turned ON.

6 Claims, 6 Drawing Sheets

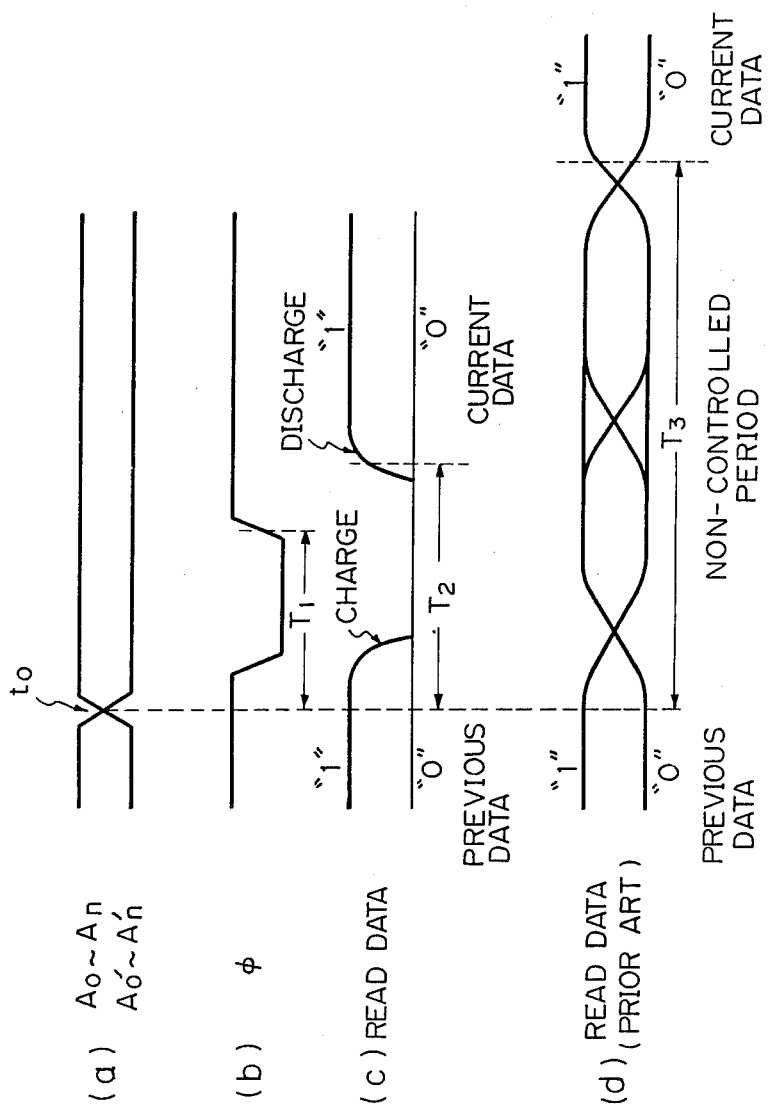

DATA READ CIRCUIT FOR USE IN SEMICONDUCTOR MEMORY DEVICE

This application is a continuation of application Ser. No. 001,780, filed Jan. 9, 1987, now abandoned.

BACKGROUND OF THE INVENTION

1. Field of the Invention

The present invention relates to a semiconductor memory device such as an electrically programmable read only memory (EPROM), more particularly, to an improvement of a sense amplifier in such a semiconductor memory device.

2. Description of the Related Art

In general, in an EPROM or other semiconductor memory device, in the program mode, predetermined data is programmed from a data programming circuit to a selected memory cell by storing, or not storing, electric charges at the floating gate of the cell transistor constituting the selected memory cell. On the other hand, in the read mode, the data programmed in the cell transistor is read out by sensing whether or not such electric charges are stored in the floating gate of the cell transistor constituting the selected memory cell.

When programming data "0" in a selected cell transistor of the memory cell array, electrons are accumulated in the floating gate of the selected cell transistor. When reading the data, the cell transistor does not become conductive even if the selection signal is applied to the control gate. The nonconductive state of the cell transistor is detected by the sense amplifier, whereby the programmed data "0" is read out through the sense amplifier.

On the other hand, when programming data "1" in a selected cell transistor of the memory cell array, electrons are not accumulated in the floating gate of the selected cell transistor. Therefore, in the read mode, when the selection signal is applied to the control gate, the cell transistor becomes conductive. The conductive state of the cell transistor is detected by the sense amplifier, whereby the programmed data "1" is read out through the sense amplifier.

In general, however, in this type of semiconductor memory device, in the read mode, changes in the selected address are accompanied by charging up of the stray capacitance on the bit lines (when the read data changes from "1" to "0") or discharging of the same (when the read data changes from "0" to "1"). To increase the readout speed of the correct data after such address changes, it is necessary to speed up the chargeup or discharging of the stray capacitance. To increase the speed of the chargeup of the stray capacitance, the chargeup transistors must be made larger in size. On the other hand, to increase the speed of the discharging of the stray capacitance (discharging through a selected cell transistor), that cell transistor must be made larger in size.

However, it is not possible to increase the size of the cell transistors that much, as they are provided in large numbers in usual memory cell arrays. Consequently, the speed of discharge of the stray capacitance to the selected cell transistor falls. On the other hand, since the chargeup transistors, which become the load transistors for that cell transistor, are made a size commensurate with the size of that cell transistor, it is not possible to make the chargeup transistors that large either. As a result, the speed of chargeup of the stray capacitance also falls. In consequence, in the sense amplifiers of the prior art, the speed of reading correct data after address changes has been slow.

SUMMARY OF THE INVENTION

The present invention was made to resolve the above-mentioned problem and has as its object the reduction of the time from the change of an address to the output of correct data corresponding to the changed address, and thus the improvement of the speed of reading data when the address changes.

According to the present invention, for achieving this object, there is provided a data read circuit for use in a semiconductor memory device including an input node operatively connected to a bit line; an output node for outputting a read-out signal; a first transistor connected between the input node and the output node and turned ON and OFF in accordance with a potential of the bit line connected to a selected memory cell transistor; a second transistor connected to the output node and turned ON for a predetermined period after an address signal is changed; and a third transistor connected to the second transistor in parallel and turned ON and OFF in accordance with the read-out signal so that the third transistor is turned OFF when the selected memory cell transistor is turned ON.

Through this construction, when the data to be read out through a bit line changes from, for example, "0" to "1", the third transistor turns OFF in accordance with the high potential output data. Further, except at the instant when the address signal changes, the second transistor is also OFF, so that the load of the cell transistor disappears. In that state, the current discharging from the stray capacitance on the bit line to the cell transistor can be made large, and thus the discharging can be performed rapidly.

On the other hand, when the data to be read out changes from, for example, "1" to "0", the stray capacitance on the bit line can be rapidly charged up through the second transistor, which becomes conductive upon the change of the address signal.

As a result, the speed of reading data after address changes can be increased.

BRIEF DESCRIPTION OF THE DRAWINGS

The present invention will become clearer by way of the following description made in reference to the accompanying drawings, wherein:

FIGS. 6(a)–6(d) are timing charts showing a comparison of the reading speed of data upon address changes in the case of use of the sense amplifier of the present invention and in the case of use of a conventional sense amplifier.

DESCRIPTION OF THE PREFERRED EMBODIMENTS

Figure 1:
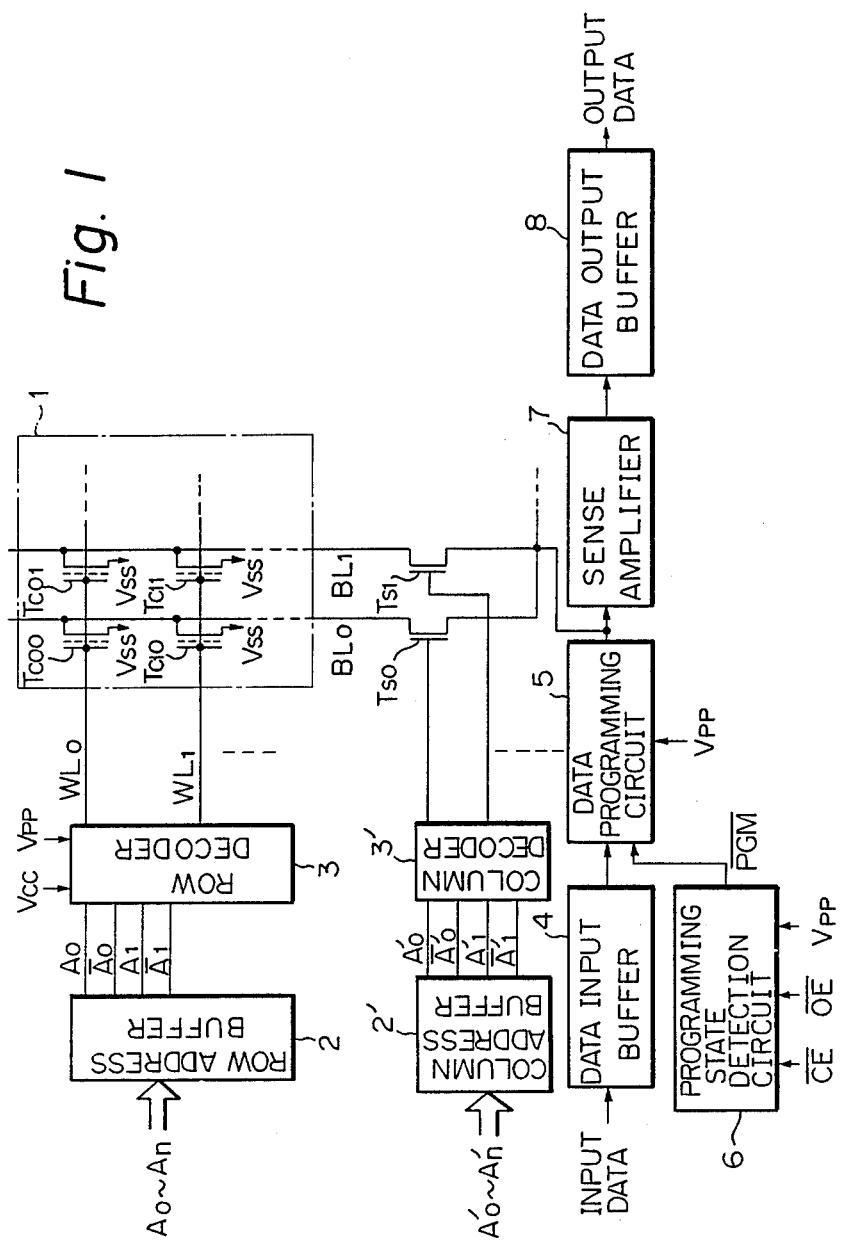
FIG. 1 is a view illustrating the overall construction of a semiconductor memory device provided with EPROM memory cells.

To clarify the background of the present invention further, an example of the overall construction of this type of semiconductor memory device is shown schematically in FIG. 1. In FIG. 1, reference numeral 1 represents a memory cell array including a predetermined number of cell transistors $T_{C00}$, $T_{C01}$, ...; $T_{C10}$, $T_{C11}$...;...; etc. Reference numeral 2 is a row address buffer, which row address buffer 2 shapes the waveforms of the row address bit signals $A_0$ to $A_n$ input therein and outputs internal row address bit signals $A_0$, $\overline{A_0}$ (inverted signal of $A_0$) to $A_n$, $\overline{A_n}$. Reference numeral 3 is a row decoder, which selects a specific word line, for example, $WL_0$, in accordance with the output states of the internal row address bit signals, and sets the potential of the selected word line $WL_0$ to, for example, the high potential and the potential of the other nonselected word lines to, for example, the low potential. In a program mode, the potential of the selected word line is made, for example, 12.5 V, by the programming DC power source $V_{pp}$, while, in a read mode, the potential of the selected word line is made, for example, 5 V by the read DC power source $V_{CC}$. The word line $WL_O$ is connected to the control gates of the cell transistors $T_{C00}$, $T_{C01}$, ..., while the word line $WL_1$ is connected to the control gates of the cell transistors $T_{C10}$, $T_{C11}$, ..., and so on.

On the other hand, reference numeral 2' is a column address buffer, which column address buffer 2' shapes the waveforms of the column address bit signals $A'_0$ to $A'_n$ input, thereto and outputs internal column address bit signals $A'_0$, $\overline{A'_0}$ to $A'_n$, $\overline{A'_n}$. Reference numeral 3' is a column decoder, which selects a specific bit line, for example, $BL_0$ in accordance with the output states of the internal column address bit signals and supplies, for example, a high potential selection signal to the gate of the transfer gate transistor, for example, $T_{S0}$, connected to the selected bit line $BL_0$ and sets the gate potential of the transfer gate transistors, for example, $T_{S1}$, connected to the other nonselected bit lines to the low potential.

In the memory cell array 1, the cell transistors $T_{C00}$, $T_{C01}$, ...; $T_{C10}$, $T_{C11}$...;... constituting the memory cells are provided with floating gates (shown by dotted lines) in addition to the control gates connected to the word lines.

When programming data "0" into a predetermined cell transistor, for example, $T_{C00}$, a bit line $BL_0$ is selected by the column decoder 3', a word line $WL_0$ is selected by the row decoder 3, and a predetermined high potential (for example, 12.5 V) is applied to the control gate of the cell transistor $T_{C00}$. Further, a programming state detection signal $\overline{PGM}$ supplied from a programming state detection circuit 6 is input to the data programming circuit 5 and programming data "0" is input to the data programming circuit 5 via the data input buffer 4, whereby the potential of the output side of the data programming circuit 5 is made high potential (for example, 7.5 V). Note that when the programming state detection circuit 6 is supplied with a programming potential $V_{pp}$, and a low potential chip enable signal $\overline{CE}$ and high potential output enable signal $\overline{OE}$ are input to the circuit 6, the circuit 6 outputs a programming state detection signal $\overline{PGM}$ of the predetermined potential (in this case, low potential). By this, the cell transistor $T_{C00}$ is made conductive, and the hot electrons generated by the ensuing avalanche breakdown are stored in the floating gate of the cell transistor $T_{C00}$ under the action of the high potential applied to the control gate of the cell transistor $T_{C00}$. As a result, cell transistors in which data "0" is programmed do not become conductive during the read mode even when the predetermined read potential (for example, 5 V) is applied to the control gate thereof through the word lines. By detecting this nonconductive state of the cell transistors, the fact that the data stored in the corresponding cell transistor is "0" is read out via a sense amplifier 7 and data output buffer 8.

On the other hand, when programming data "1" into a predetermined cell transistor, the data programming circuit 5 receives as input the programming state detection signal $\overline{PGM}$ supplied from the programming state detection circuit 6 and the programming data (in this case, "1") is input to the data programming circuit 5 via the data input buffer 4, whereby the output side of the data programming circuit 5 enters a floating state (0 V). By this, when programming data "1", the cell transistor $T_{C00}$ does not become conductive and no electrons are stored in the floating gate. Therefore, cell transistors in which data "1" is programmed become conductive during the read mode through the application of the above predetermined read potential to the control gates via the word lines. By detecting this conductive state of the cell transistors, the fact that the data stored in the corresponding cell transistor is "1" is read out via the sense amplifier 7 and data output buffer 8.

Figure 2:
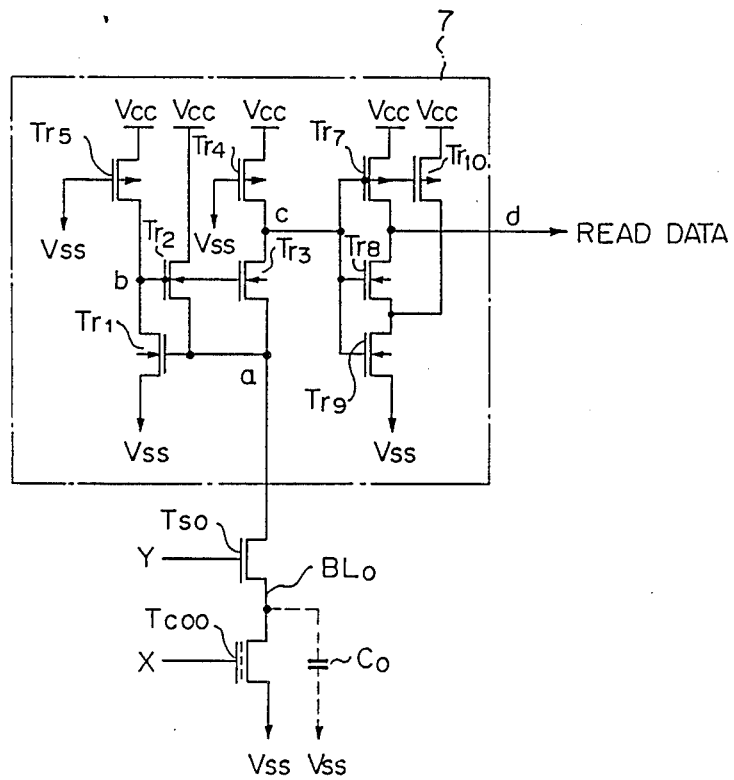
FIG. 2 is a circuit diagram illustrating an example of a conventional sense amplifier used for the semiconductor memory device shown in FIG. 1.

FIG. 2 shows a prior art sense amplifier in this type of semiconductor memory device. In the figure, only one bit line $BL_0$ is shown connected to the sense amplifier 7 and further only one EPROM cell transistor $T_{C00}$ (with floating gate) is shown connected to the bit line $BL_0$. Note that $T_{S0}$ is a transfer gate transistor which becomes conductive when the bit line $BL_0$ is selected by the selection signal Y from the column decoder 3'. Note also that the control gate of the cell transistor $T_{C00}$ is given a selection signal X from the row decoder 3 through the word line driver.

Here, an explanation will be made of the operation of the sense amplifier 7 during reading of data programmed in the cell transistor $T_{C00}$ shown in FIG. 2. Note that when the data "0" is programmed in the cell transistor $T_{C00}$, electrons are accumulated in the floating gate and, in the read mode, the cell transistor $T_{C00}$ will not become conductive even if the selection signal X (having a predetermined read potential) is applied to the control gate. On the other hand, when the data "1" is programmed in the cell transistor $T_{C00}$, no electrons are accumulated in the floating gate. Therefore, in the read mode, the cell transistor $T_{C00}$ becomes conductive along with the application of the selection signal X to the control gate.

Suppose now that data "1" is programmed into the cell transistor $T_{C00}$. In the read mode, when the cell transistor $T_{C00}$ is selected and the data "1" is read out, the potential at the node a leading to the bit line $BL_0$ becomes, for example, about 1.0 V (low potential) in the steady state.

Due to this, the N channel transistor $Tr_1$ becomes ON and the potential of the node b becomes, for example, about 2 V (high potential). As a result, a potential of about 1 V is applied between the gate and source of the N channel transistors $Tr_2$ and $Tr_3$ and they become ON. Note that the P channel transistor $Tr_5$ and N channel transistor $Tr_1$ form an inverter circuit. Further, the P channel transistor Tr$_4$, which is connected in series with the N channel transistor Tr$_3$, receives V$_{CC}$ (usually 5 V) at its source and, on the other hand, V$_{SS}$ (0 V) at its gate, and thus is placed in a conductable state. However, since it is formed by a transistor with a small mutual conductance, only a small current can flow therethrough. In this way, the current which flows through the cell transistor T$_{C00}$ balances with the sum of the current flowing through the N channel transistor Tr$_2$ and the current flowing through the P channel transistor Tr$_4$ and the N channel transistor Tr$_3$. The potential of the node c stabilizes at the state where it becomes roughly the potential of the node a (in other words, in the state where a potential drop is caused at the P channel transistor Tr$_4$), i.e., in the low potential state (approximately 1.0 V). The potential of the node c (approximately 1.0 V) is inverted by the Schmitt circuit, comprised of the transistors Tr$_7$ to Tr$_{10}$, and, for example, data "1" of a high potential of 5 V is output through the sense amplifier 7 from the node d.

On the other hand, if the data "0" is programmed in the cell transistor T$_{C00}$, when the data "0" is read out, the potential of the node a connected to the bit line BL$_0$ becomes about 1.1 V (high potential) in the steady state.

By this, the transistor Tr$_1$ becomes ON, the potential of the node b falls to about 1.8 V (low potential), and, thereby, the potential between the gate and source of the transistors Tr$_2$ and Tr$_3$ becomes about 0.7 V and the transistors Tr$_2$ and Tr$_3$ turn OFF. As a result, the P channel transistor Tr$_4$ enters into a conductable state, but there is no flow of constant current and thus the potential of the node c is pulled up to about V$_{CC}$ (usually 5 V), then the transistor Tr$_4$ turns OFF. Next, the potential of the node c (approximately 5 V) is inverted by the Schmitt circuit comprised of the transistors Tr$_7$ to Tr$_{10}$ and data "0" of a low potential of 0 V, for example, is output through the sense amplifier 7 from the node d.

In general, however, in this type of semiconductor memory device, in the read mode, changes in the selected address are accompanied by charging up of the stray capacitance (in FIG. 2, shown as C$_0$) on the selected bit line (when the read data changes from "1" to "0") or discharging of the same (when the read data changes from "0" to "1"). To increase the reading speed of the read data under such changes of the selected address, it is necessary to speed up the chargeup or discharging of the stray capacitance. To increase the speed of the chargeup of the stray capacitance, the chargeup transistors Tr$_2$ and Tr$_3$ must be made larger in size (the mutual conductance must be made larger). On the other hand, to increase the speed of the discharging of the stray capacitance, the selected cell transistor, for example, T$_{C00}$, must be made larger in size.

However, it is not possible to increase the size of the cell transistors that much, as they are provided in large numbers in usual memory cell arrays. Consequently, the speed of discharge from the stray capacitance to the selected cell transistor falls. On the other hand, since the chargeup transistors Tr$_2$ and Tr$_3$, which become the load transistors for that cell transistor, are made a size commensurate with the size of that cell transistor, it is not possible to make the chargeup transistors Tr$_2$ and Tr$_3$ that large either. As a result, the speed of chargeup of the stray capacitance also falls. In consequence, in the sense amplifiers of the prior art, the speed of reading data after address changes, i.e., the data switching speed, has been slow.

Figure 3:
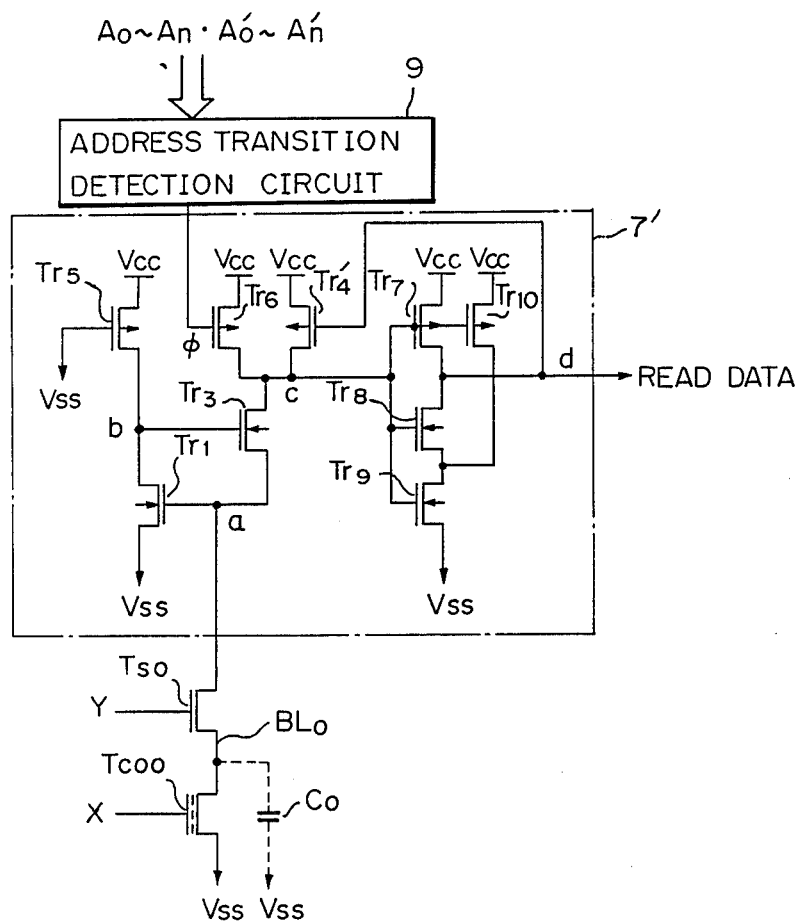
FIG. 3 is a circuit diagram of a sense amplifier of an embodiment of the present invention used for the semiconductor/memory device shown in FIG. 1.

The present invention is meant to resolve this problem. FIG. 3 shows an embodiment of the sense amplifier portion of a semiconductor memory device according to the present invention. The sense amplifier 7' is provided with a P channel transistor Tr$_6$ which becomes conductive only when a clock signal $\phi$ generated from the address transition detection circuit 9 is input in accordance with changes in the selected address (changes in potential of any of the row address bit signals A$_0$ to A$_n$ and column address bit signals A'$_0$ to A'$_n$) and a P channel transistor Tr'$_4$, which is connected in parallel with the transistor Tr$_6$ and which is controlled in conductive state (made ON or OFF) by the feedback potential from the data output side (node d). Here, the P channel transistor Tr$_6$ is formed by a transistor with a large mutual conductance, while the P channel transistor Tr'$_4$, is formed by a transistor with a small mutual conductance (usually, a transistor with a mutual conductance smaller than the P channel transistor Tr$_4$ shown in the prior art example of FIG. 2).

Suppose now that data "1" is programmed into the cell transistor T$_{C00}$ shown in FIG. 3. When that data "1" is read out, the potential of the node a connected to the bit line BL$_0$ becomes, for example, about 0 V in the steady state.

By this, the N channel transistor Tr$_1$ becomes OFF, the potential of the node b becomes about V$_{CC}$ (5 V), and N channel transistor Tr$_3$ turns ON, and the current flowing through the cell transistor T$_{C00}$ balances with the extremely small current flowing through the extremely small mutual conductance P channel transistor Tr'$_4$ and N channel transistor Tr$_3$. The potential of the node c stabilizes in the state where it is roughly the potential of the node a (about 0 V), i.e., in the low potential state. The potential of the node c (approximately 0 V) is inverted by the Schmitt circuit comprised of the transistors Tr$_7$ to Tr$_{10}$ and the data "1" of the high potential of 5 V, for example, is output through the sense amplifier 7' from the node d. Also, when the potential of the output side (node d) of the Schmitt circuit rises to about 5 V, the potential of the node d is fed back to the P channel transistor Tr'$_4$ and the P channel transistor Tr'$_4$ is cut off. At this time, the P channel transistor Tr$_6$ which is connected in parallel to the transistor Tr'$_4$ is also cut off (it is ON only when address changes), so the current passing through the load transistors for the cell transistor T$_{C00}$ to the cell transistor is eliminated. Therefore, a large discharge current can flow from the stray capacitance C$_0$ of the bit line to the cell transistor T$_{C00}$ and the speed of reading of the data "1" can be increased by that amount. In this regard, in the prior art circuit shown in FIG. 2, most of the current flowing through the cell transistor ends up being used for the current flowing from the load transistors and thus the current discharged from the stray capacitance C$_0$ to the cell transistor could not be made larger.

On the other hand, when switching the address selection from the cell transistor T$_{C00}$ in which the data "1" is programmed to a cell transistor in which the data "0" is programmed, the clock signal $\phi$ shown in FIG. 6(b), generated upon changes in potential of any of the address bit signals A$_0$ to A$_n$ and A'$_0$ to A'$_n$ as shown in FIG. 6(a), is input to the P channel transistor Tr$_6$, whereupon the transistor Tr$_6$ turns on for an instant. At the start of the change of address, the potential of the node d is still close to 5 V, so the transistor Tr'$_4$ is OFF. However, as mentioned above, the transistor Tr$_6$ is ON, so the potential of the node c rises to about V$_{CC}$ On the other hand, the potential of the node d is inverted by the Schmitt circuit and becomes low potential (0 V). By this, the transistor Tr'$_4$ becomes ON and, along with the disappearance of the clock signal $\phi$, the transistor Tr$_6$ becomes OFF.

In this way, when the data read out through the bit line changes from "1" to "0", the large mutual conductance transistor Tr$_6$ becomes ON upon the change of address, the stray capacitance on the bit line is rapidly charged up through the large mutual conductance transistor Tr$_6$, and the reading speed of the data "0" thus can be raised. Note that, in the subsequent steady state, although the transistor Tr$_6$, as mentioned above, turns OFF, the transistor Tr'$_4$ turns ON and the potential of the node d is maintained at the low potential. Further, the potential of the node a becomes about 1.1 V, for example, in the steady state, the transistor Tr$_1$ enters the ON state, the potential of the node b falls to about 1.8 V, and the transistor Tr$_3$ turns OFF.

Further, when the data read out through the bit line changes from "0" to "1" due to a change of the address selection, the transistor Tr$_6$ turns ON once due to the clock signal $\phi$ generated only during changes of the address signal and, at that instant alone, the data of the output side becomes "0" (see time T$_2$ in FIG. 6(c)). The transistor Tr$_6$ turns OFF again along with the extinguishment of the clock signal $\phi$ and in the subsequent steady state, the potential of the node a falls to about 0 V. Subsequent to this, through the above-mentioned operational process, the potential of the node d rises to about 5 V, the transistor Tr'$_4$ is also cut off, and the discharge current flowing from the stray capacitance on the bit line to the cell transistor can be made large, as mentioned above.

Figure 4:
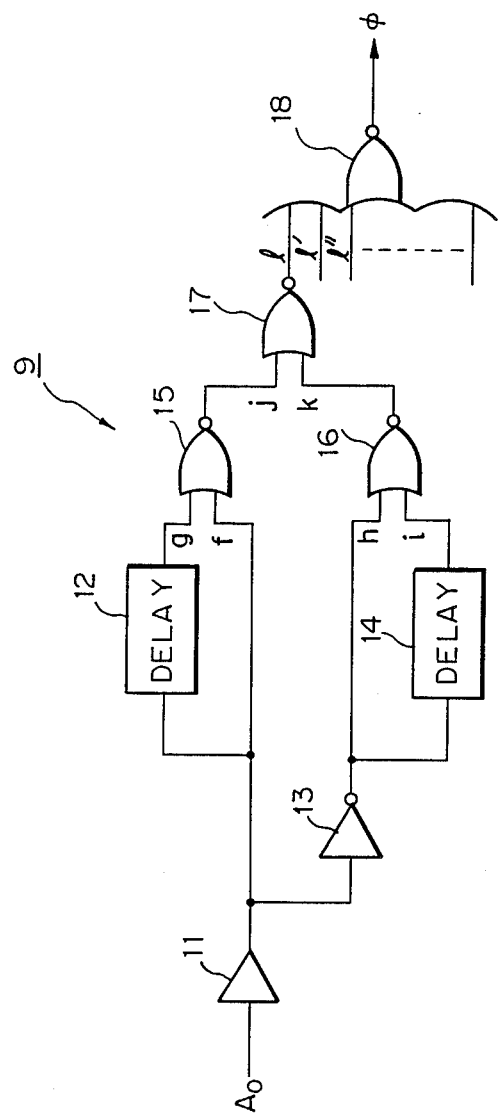
FIG. 4 is a circuit diagram of a specific example of an address transition detection circuit in the sense amplifier shown in FIG. 3.

FIG. 4 shows an example of the address transition detection circuit 9 shown in FIG. 3, illustrating in detail the portion for detecting potential changes in the address bit signal A$_0$. Reference numeral 11 is a buffer circuit, 13 an inverter, 12 and 14 delay circuits, and 15, 16, and 17 NOR gates.

Figure 5:
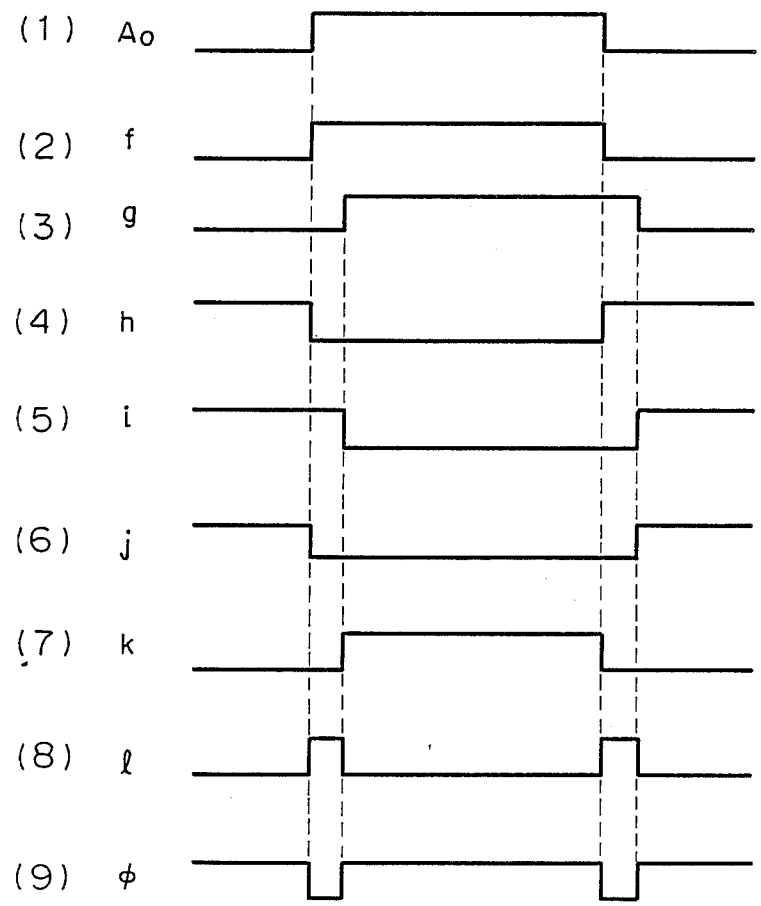
FIGS. 5(1)–5(9) are timing charts showing the operation of the address transition detection circuit shown in FIG. 4.

Suppose now that the address bit signal A$_0$ input to the buffer circuit 11 changes in potential as shown in FIG. 5(1). The output level f of the buffer circuit 11 becomes as shown in FIG. 5(2), the output level f and the output level g, the result of the delay of the output level f by the delay circuit 12 (see FIG. 5(3)), are input to the NOR gate 15, and the potential of the output signal j of the NOR gate 15 becomes as shown in FIG. 5(6). On the other hand, the output level h, which is the result of inversion of the output level f of the buffer circuit by the inverter 13, becomes as shown in FIG. 5(4), the output level i, which is the result of delay of the output level h by the delay circuit 14 (see FIG. 5(5)) are input to the NOR gate 16, and the potential of the output signal k of the NOR gate 16 becomes as shown in FIG. 5(7).

Therefore, the level of the output signal l of the NOR gate 17, to which are input the output signals j and k, becomes high potential only when potential of the address bit signal A$_0$ changes, as shown in FIG. 5(8). In the same way, when there is a change in potential in any of the other address bit signals A$_1$ to A$_n$ and A'$_0$ to A'$_n$, the output signals l', l'', etc., each of which becomes high potential only when potential of the corresponding address bit signal changes, are obtained. Therefore, if these output signals l, l', and l'' are input to the NOR gate 18, the output side of the NOR gate 18 will give a clock signal $\phi$ (see FIG. 5(9)) which becomes low potential only when potential of the selected address signal changes (only upon changes in potential of any of the row address bit signals A$_0$ to A$_n$ or column address bit signals A'$_0$ to A'$_n$).

FIG. 6 is a timing chart showing a comparison of the reading speed of data upon address changes in the case of use of the sense amplifier of the present invention and the case of use of a conventional sense amplifier. As shown in FIG. 6(a), when any of the row address bit signals A$_0$ to A$_n$ or column address bit signals A'$_0$ to A'$_n$ change in potential at a time t$_0$, a clock signal $\phi$ is generated, as shown in FIG. 6(b), by the address transition detection circuit 9. FIG. 6(c) shows the potential change of the read data in the case of use of the sense amplifier of the present invention (potential change of node d of FIG. 3). In the case of a change of address, the transistor Tr$_6$ becomes ON for an instant due to the clock signal $\phi$, the stray capacitance C$_0$ is rapidly charged up, and the potential of the node d becomes low potential. When the current data corresponding to the address after the change is "0", the potential of the node d maintains the low potential. On the other hand, when the current data is "1", the transistor Tr$_6$ turns OFF along with the extinguishment of the clock signal $\phi$, the transistor Tr'$_4$ also turns OFF, and the discharge from the stray capacitance to the cell transistor is rapidly effected. The time from the change of the selected address at time t$_0$ to the output of the correct data corresponding to the address after the change (shown as T$_2$ in FIG. 6(c)) can thus be shortened. In this case, the time T$_1$ shown in FIG. 6(b), that is, the time from the change of the selected address until the extinguishment of the clock signal $\phi$, is, for example, about 50 nanoseconds and the time T$_2$ shown in FIG. 6(c) is, for example, 70 nanoseconds.

FIG. 6(d) shows the potential change of read out data (potential change of node d of FIG. 2) in the case of use of the prior art-sense amplifier. When there is a change in the selected address, the correct data corresponding to the changed address is output after a "non-controlled period". The "non-controlled period" T$_3$ until the correct data is output after a change in the selected address is a relatively long one, for example, 150 nanoseconds.

According to the present invention, when data read out from a bit line is changed along with changes in the selected address, the speed of charging of the stray capacitance existing on the bit line or of discharging from the stray capacitance existing on the bit line to the cell transistor is increased, whereby the reading speed of correct data after address changes can be improved.

I claim:

1. A data read circuit for use in a semiconductor memory device comprising:
   an input node connected to a bit line of said memory device;
   an output node for outputting a read-out signal;
   a first transistor connected between said input node and said output node and turned ON and OFF in accordance with a potential of the bit line connected to a selected memory cell transistor;
   a power source terminal;
   a second transistor connected between said power source terminal and said output node;
   an address transition detection circuit for generating a pulse signal in response to transition of potential of an address signal, said second transistor being connected to said address transition detection circuit and being momentarily turned ON in response to said transition of said address signal; and a third transistor having source and drain electrodes connected to said second transistor in parallel and turned ON and OFF in accordance with the read-out signal so that said third transistor is turned OFF when said selected memory cell transistor is turned ON.

2. A data read circuit according to claim 1, wherein said first transistor is an N channel type transistor having a source electrode connected to said input node and a drain electrode to connected to said output node, said circuit further comprising an inverter circuit including a fourth transistor and a fifth transistor connected in series and having a input connected to said input node and an output at the junction of said fourth and fifth transistors connected to a gate electrode of said first transistor.

3. A data read circuit according to claim 1, further comprising a Schmitt circuit having an input connected to said output node and an output connected to a gate electrode of said third transistor.

4. A data read circuit according to claim 1, wherein a value of mutual conductance of said second transistor is larger than that of said third transistor.

5. A data read circuit for use in a semiconductor memory device comprising:
   an input node connected to a bit line of said memory device;
   an output node for outputting a read-out signal;
   a first transistor connected between said input node and said output node and turned ON and OFF in accordance with a potential of the bit line connected to a selected memory cell transistor;
   a power source terminal;
   a second transistor connected between said power source terminal and said output node; and
   an address transition detection circuit for generating a pulse signal in response to transition of potential of an address signal, said second transistor being connected to said address transition detection circuit and being momentarily turned ON in response to an address transition.

6. A data read circuit for use in a semiconductor memory device comprising:
   an input node connected to a bit line of said memory device;
   an output node for outputting a read-out signal;
   a first transistor connected between said input node and said output node and turned ON and OFF in accordance with a potential of the bit line connected to a selected memory cell transistor;
   a power source terminal;
   a second transistor connected between said power source terminal and said output node;
   an address transition detection circuit for generating a pulse signal in response to transition of potential of an address signal, said second transistor being connected to said address transition detection circuit to be turned ON in response to said pulse signal for a predetermined period after such transition; and
   a third transistor having source and drain electrodes connected to said second transistor in parallel and turned ON and OFF in accordance with the read-out signal so that said third transistor is turned OFF when said selected memory cell transistor is turned ON,
   wherein a value of mutual conductance of said second transistor is larger than that of said third transistor.

* * * * *